United States Patent
Lou

(10) Patent No.: US 6,323,112 B1
(45) Date of Patent: Nov. 27, 2001

(54) METHOD OF FABRICATING INTEGRATED CIRCUITS

(75) Inventor: Chine-Gie Lou, Hsinchu Hsien (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 09/498,329

(22) Filed: Feb. 4, 2000

(30) Foreign Application Priority Data

Jan. 4, 2000 (TW) ............................................. 089100041

(51) Int. Cl.[7] ................................................... H01L 21/76
(52) U.S. Cl. ............................................. 438/514; 438/296
(58) Field of Search ............................... 437/40, 44, 160, 437/164; 438/296, 595, 596, 514

(56) References Cited

U.S. PATENT DOCUMENTS

| | | | |
|---|---|---|---|
| 4,599,118 | * | 7/1986 | Han et al. ............................... 148/1.5 |
| 4,732,871 | * | 3/1988 | Buchmann et al. ..................... 437/41 |
| 4,933,994 | * | 6/1990 | Orban ..................................... 437/44 |
| 5,559,049 | * | 9/1996 | Cho ......................................... 437/44 |
| 6,054,355 | * | 4/2000 | Inumiya et al. ....................... 438/296 |

* cited by examiner

*Primary Examiner*—David Nelms
*Assistant Examiner*—David Vu
(74) *Attorney, Agent, or Firm*—Jiawei Huang; J.C. Patents

(57) ABSTRACT

A method of fabricating integrated circuits. An oxide layer and a patterned dummy gate layer are formed on a substrate. The patterned dummy gate layer is used as an implantation mask in a first ion implantation step to form a source/drain in the substrate. After performing a step to reduce the width of the patterned dummy gate layer, the narrower patterned dummy gate layer is used as an implantation mask in a second ion implantation step to form a source/drain extension in the substrate. A planarized dielectric layer is formed over the substrate; after which the dummy gate layer and the underlying oxide layer are removed to form an opening inside the dielectric layer. A gate dielectric layer and a metal gate are formed inside the opening.

22 Claims, 5 Drawing Sheets

METHOD OF FABRICATING INTEGRATED CIRCUITS

CROSS-REFERENCE TO RELATED APPLICATION

This application claims the priority benefit of Taiwan application serial no. 89100041, filed Jan. 4, 2000.

BACKGROUND OF THE INVENTION

1. Field of Invention

The present invention relates to a method of fabricating integrated circuits (IC). More particularly, the present invention relates to a method of fabricating a metal-oxide-semiconductor (MOS) device.

2. Description of Related Art

The conventional method of fabricating the MOS device is to form a gate oxide layer and a polysilicon gate on the substrate. The polysilicon gate is used as the implantation mask, while dopants are implanted in the substrate by ion implantation to form the source/drain extension. After spacers are formed on sidewalls of the polysilicon gate, dopants are ion-implanted in the substrate to form the source/drain while using the polysilicon gate and spacers as the implantation mask. Afterwards, a high temperature annealing process is used to activate dopants in the source/drain extension and the source/drain. Lastly, a dielectric layer is formed over the substrate for further metal interconnects process.

In order to be compatible with the market requirement for the minimum device size, the semiconductor devices are manufactured with high integration at the present. The conventional method for increasing gate capacitance of the MOS device is to decrease the thickness of the gate oxide layer. However, it is not possible to keep decreasing the thickness of the gate oxide layer, especially when IC manufacture is moving into the sub micron processes. When the thickness of the oxide layer decreases to a certain level, the defects in the oxide layer cause current leakage of the device and reduction of drain current, and may even lead to severe short channel effect.

On the other hand, polysilicon or polycide material is used to form the gate layer in the conventional MOS device. In general, dopants are implanted in the polysilicon to increase its conductivity and reduce its resistivity. However, the dopant concentration is pretty limited in the polysilicon, which causes restricted resistivity reduction and further influences the speed as well as operation performance. Moreover, a depletion region is formed during the operation and a depletion capacitor is induced in this MOS device made of polysilicon or polycide material, causing capacitance of the whole transistor to decrease.

In addition, the boron atoms implanted during the ion implantation process of the source/drain extension and the source/drain might inject along the polysilicon lattice and penetrate the gate oxide layer. This raises problems in the electrical properties of the device. Furthermore, the high temperature annealing process performed after the ion implantation process of the source/drain extension and the source/drain causes changes in the implantation profile and results in a deeper junction depth than desired.

SUMMARY OF THE INVENTION

The invention provides a method of fabricating a MOS device, which can provide enough gate capacitance and prevent current leakage in the gate dielectric layer.

The invention provides a method of fabricating a MOS device, which method leaves a definite thickness of the gate dielectric layer to prevent poor reliability resulting from the gate dielectric layer being too thin as in the prior art, and provides enough gate current.

The invention provides a method of fabricating a MOS device, which method can prevent boron atoms from penetrating the gate made of polysilicon material, as in the prior art, and prevent the problems that would arise from the capacitance depletion region.

The invention provides a method of fabricating a MOS device, which method can reduce gate resistivity to enhance the operation performance of the device.

The invention provides a method of fabricating a MOS device, which method provides the source/drain extension with a shallow junction depth and maintains the implantation profile.

According to the purpose of the invention, a method of fabricating a MOS device is provided herein. An oxide layer is formed on a substrate; and a patterned dummy gate layer and a patterned cap layer are formed sequentially on the oxide layer. After reducing the width of the patterned dummy gate layer, the patterned cap layer serving as an implantation mask is used in a first ion implantation step to form a source/drain in the substrate. After removing the patterned cap layer, the narrower patterned dummy gate layer is used as an implantation mask for a second ion implantation step to form a source/drain extension in the substrate. Afterwards, a planarized dielectric layer is formed on the substrate and the top of the dummy gate layer is exposed. The dummy gate layer and its underlying oxide layer are removed to form an opening, which exposes the surface of the substrate, in the dielectric layer. A gate dielectric layer is formed on the bottom and sidewalls of the opening, and a metal gate is formed subsequently inside the remaining space of the opening.

According to the purpose of the invention, another method of fabricating a MOS device is provided herein. An oxide layer and a patterned dummy gate layer are formed on the surface of a substrate. The patterned dummy gate layer serving as an implantation mask is then used in a first ion implantation step to form a source/drain in the substrate. After performing a step to reduce the width of the patterned dummy gate layer, the narrower patterned dummy gate layer is used as an implantation mask for a second ion implantation step to form a source/drain extension in the substrate. Afterwards, a planarized dielectric layer is formed on the substrate. The dummy gate layer and its underlying oxide layer are then removed to form an opening, which exposes the surface of the substrate, in the dielectric layer. A gate dielectric layer is formed on the bottom and sidewalls of the opening, and a metal gate is formed subsequently inside the remaining space of the opening.

As embodied and broadly described herein, the patterned dummy gate layer is used as the implantation mask to form the source/drain. Then the width of the patterned dummy gate layer is reduced by a chemical dry etching process. The narrower patterned dummy gate layer is used as the implantation mask to form the source/drain extension. A high temperature annealing process is performed after the first ion implantation step of the source/drain, while a low temperature annealing process is performed after the second ion implantation step of the source/drain extension. The high temperature annealing process applied after the first ion implantation process of the source/drain is performed before the second ion implantation process of the source/drain extension. Additionally, the low temperature annealing process activates the source/drain extension formation with the expected profile and junction depth. Therefore, this invention can prevent the problems present in the prior art. In the prior art, the ion implantation process of the source/drain extension is applied before the high temperature annealing process, which causes problems derived from improper control of the implantation profile and the overly deep junction depth of the source/drain extension.

In contrast, the method of this invention forms the source/drain in the substrate before the metal gate. Because the high temperature annealing process of the source/drain is applied before the deposition process of the metal layer of the metal gate, the metal gate is free from damage of the high temperature annealing process.

In this invention, metal material is used for the gate as a substitute for the polysilicon or polycide material used in the prior art; therefore, the gate resistivity can be reduced to enhance the operation performance of the device. This invention prevents problems derived from the capacitance depletion region and boron penetration present is in the prior art.

In this invention, a dielectric layer with high dielectric constant is used to form the gate dielectric layer; hence the capacitance of the gate can be increased by using the high dielectric constant material in the MOS device. Therefore, it is not necessary to reduce the thickness of the gate dielectric layer in order to increase the capacitance of the MOS device in this invention. This invention prevents the prior art current leakage problem resulting from the gate dielectric layer being too thin.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. Wherever possible, the same reference numbers are used in the drawings and the description to refer to the same or like parts. In the drawings.

DESCRIPTION OF THE PREFERRED EMBODIMENTS

The First Preferred Embodiment

Figure 1A:
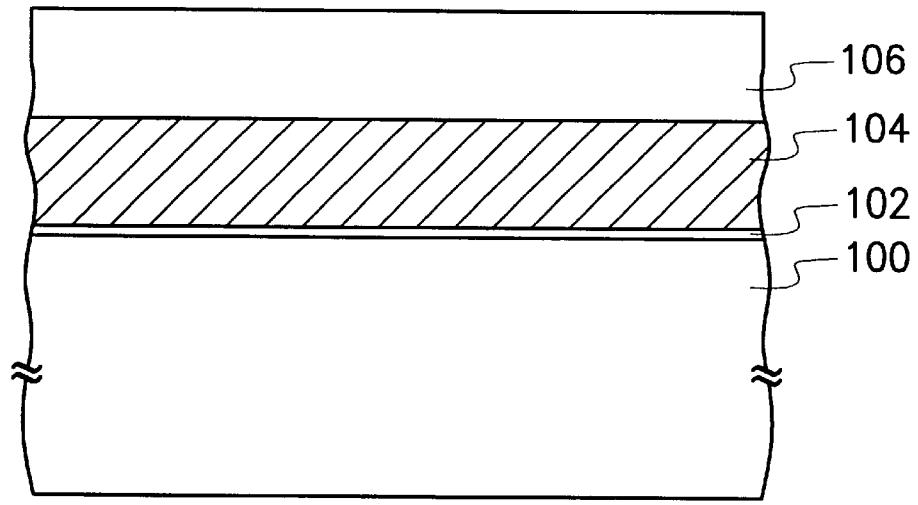
FIG. 1A to FIG. 1H are schematic, cross-sectional views illustrating the process steps of fabricating a MOS device according to the first preferred embodiment of this invention.

Referring to FIG. 1A, an oxide layer 102 is formed on a provided substrate 100 to protect the surface of the substrate 100 during the subsequent fabrication processes. The oxide layer 102 is formed by conventional methods, such as thermal oxidation to a thickness of about 50 to about 500 Angstroms. A dummy gate layer 104 and a cap layer 106 are formed sequentially on the oxide layer 102. The material of the dummy gate layer 104 has an etching rate that is different from the etching rates of the oxide layer 102 and the cap layer 106. A preferable material for the dummy gate layer 104 comprises polysilicon formed by, for example, chemical vapor deposition to a thickness of about 1000 to about 5000 Angstroms. A material of the cap layer 106 is, for example, silicon nitride formed by chemical vapor deposition to a thickness of about 1000 to about 8000 Angstrom.

Figure 1B:
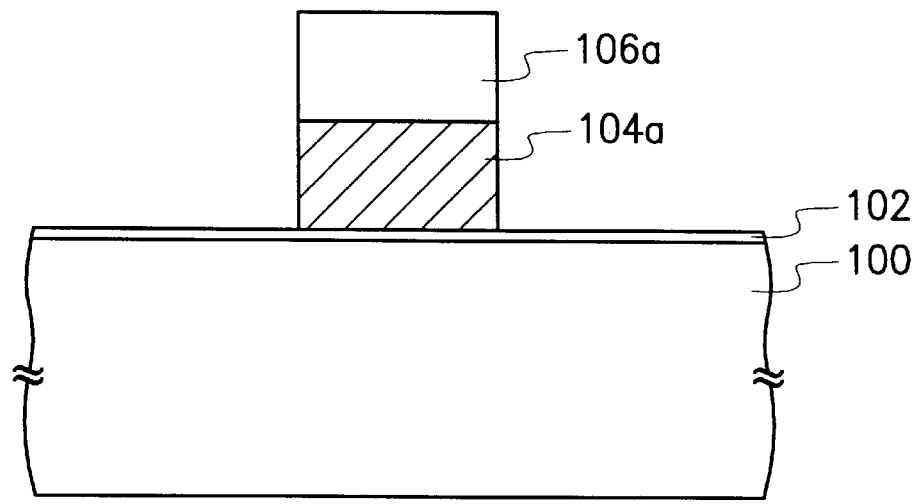

Referring to FIG. 1B, the cap layer 106 and the dummy gate layer 104 are defined by photolithography and etching to form a patterned cap layer 106a and a patterned dummy gate layer 104a. The oxide layer 102 is used as the etching stop layer for the etching process of the dummy gate layer 104 to protect the substrate 100 from etching damage.

Figure 1C:
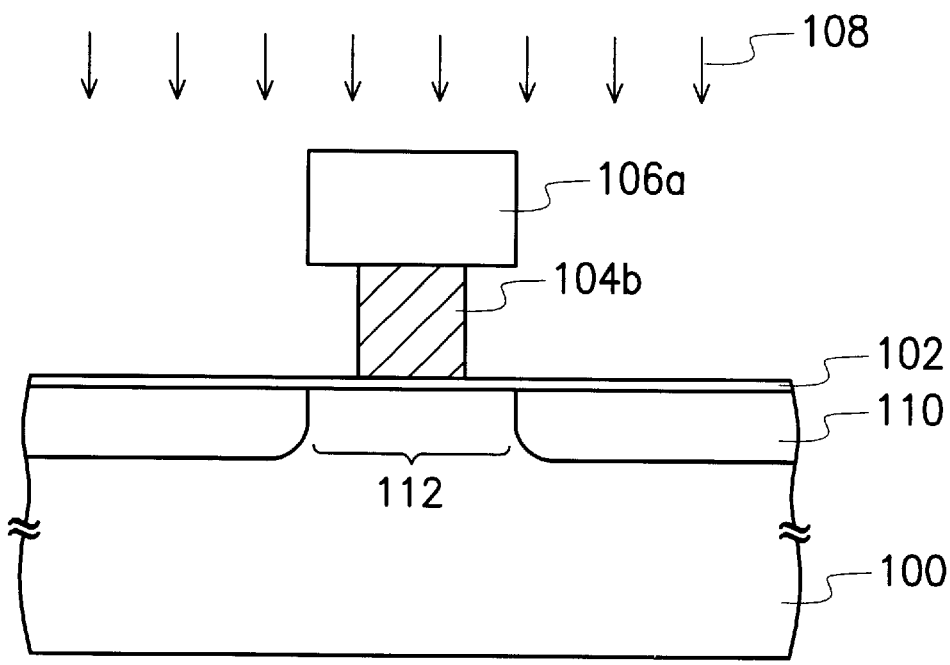

Referring to FIG. 1C, the width of the dummy gate layer 104a is reduced to form a dummy gate 104b. A preferable method for reducing the width of the dummy gate layer 104a is, for example, chemical dry etching (CDE). Then dopants are implanted into the substrate 100 by a first ion implantation process 108. Afterwards, a high temperature annealing process is performed to activate dopants in the substrate 100 so as to form the source/drain 110. The high temperature annealing process is, for example, a rapid thermal annealing process. The preferable temperature for the process is from about 950 to about 1000 degrees Centigrade. The patterned cap layer 106a is used as an implantation mask in this process. A preferable patterned cap layer 106a should be thick enough to prevent dopants from being implanted into the region of the substrate 100 masked thereby during the first ion implantation process 108, which region is indicated by reference number 112 in this figure.

Figure 1D:
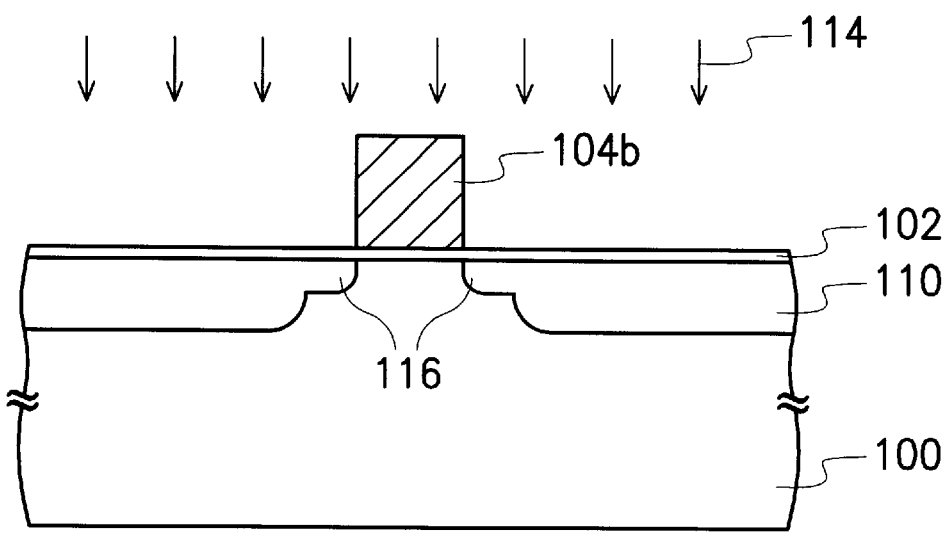

Referring to FIG. 1D, the dummy gate 104b is exposed after removing the patterned cap layer 106a. The methods for removing the patterned cap layer 106a comprise wet etching using, for example, hot phosphoric acid as the etching solution. Then a second ion implantation process 114 is performed while using the narrower dummy gate 104b as an implantation mask. A low temperature annealing process is subsequently performed to activate dopants in the substrate 100 to form the source/drain extension 116. The low temperature annealing process is, for example, a rapid thermal annealing process. The temperature in the process is from about 850 to about 900 degrees Centigrade, with a duration ranging from about 20 to about 40 seconds.

The high temperature annealing process is performed after the first ion implantation process 108 of the source/drain 110 and before the second ion implantation process 114 of the source/drain extension 116. Additionally, the low temperature annealing process activates the formation of the source/drain extension 116 with expected profile and junction depth. Therefore, this invention can prevent the problems present in the prior art. In the prior art, the ion implantation process of the source/drain extension is performed before the high temperature annealing process, which results in improper control of the implantation profile and an overly deep junction depth of the source/drain extension.

Figure 1E:
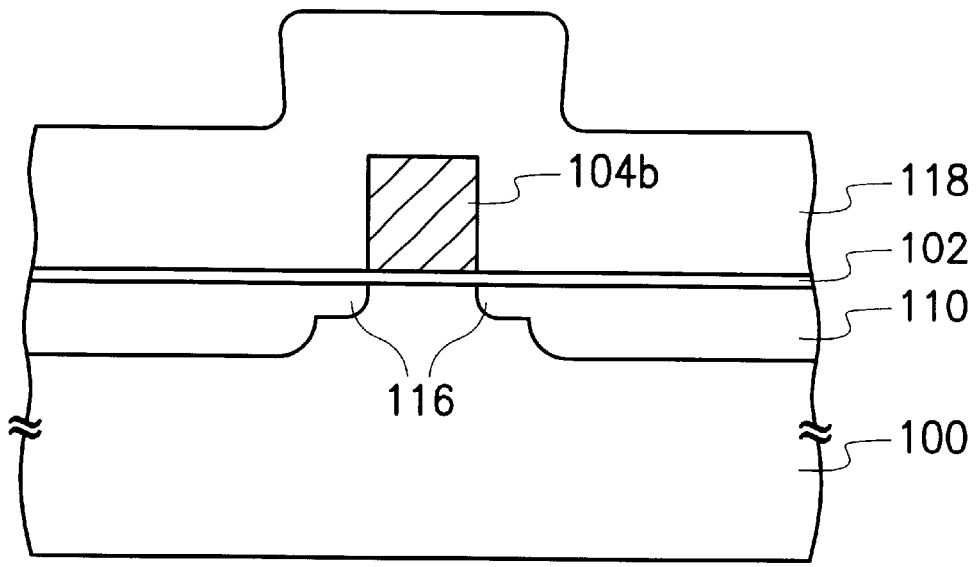

Referring to FIG. 1E, a dielectric layer 118 is formed on the substrate 100 and covers the dummy gate 104b and the oxide layer 102. A material of the dielectric layer 118 comprises silicon oxide formed by, for example, chemical vapor deposition using ozone and tetra-ethyl-ortho-silicate (TEOS) as reaction gases.

Figure 1F:
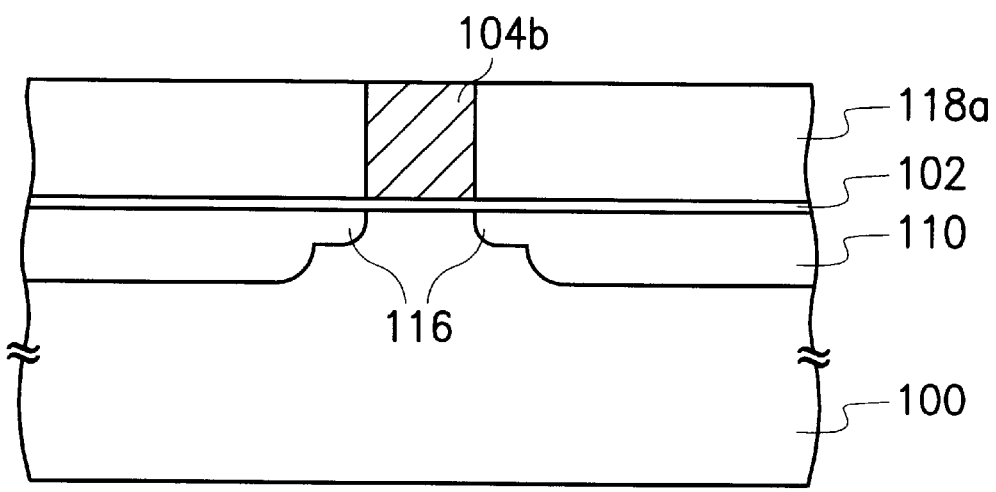

Referring to FIG. 1F, the dielectric layer 118 is removed until the top of the dummy gate 104b is exposed. As a result, the surface of the remaining dielectric layer 118a is planarized. A preferable method of planarization is chemical-mechanical polishing using the dummy gate 104b as the polishing stop layer.

Figure 1G:
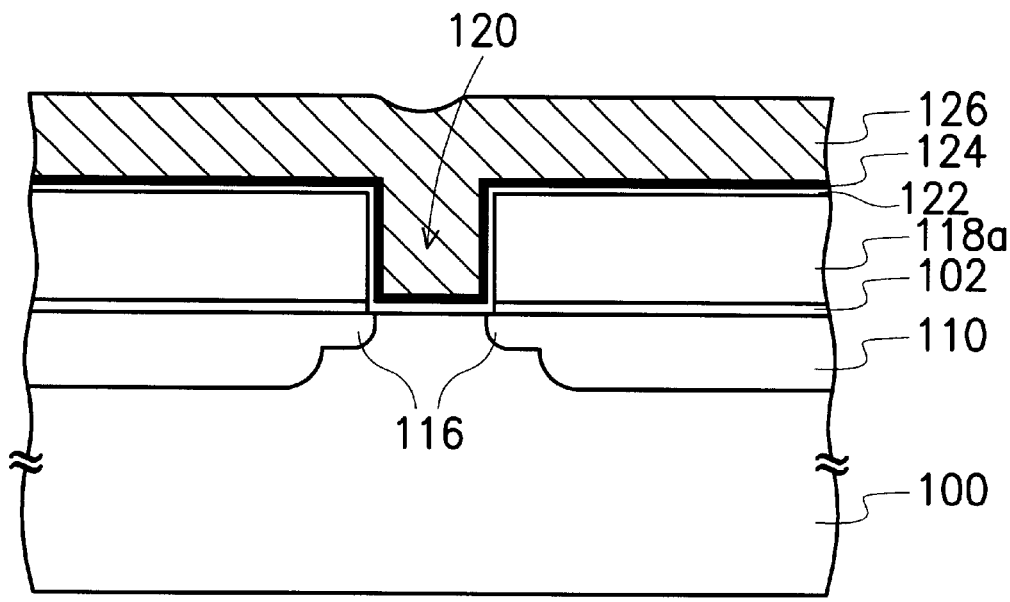

Referring to FIG. 1G, the dummy gate 104b and the underlying oxide layer 102 are removed to form an opening 120, which exposes the surface of the substrate 100 in the dielectric layer 118a. A preferable method comprises wet etching. For example, the dummy gate 104b made of polysilicon is removed first by an etching solution containing diluted nitric acid; after removing the dummy gate 104b, the exposed silicon oxide layer 102 is etched by a diluted hydrofluoric acid solution.

Again, referring to FIG. 1G, a gate dielectric layer 122 is formed on the substrate 100 and covers the surface of the dielectric layer 118a, including the bottom as well as sidewalls of the opening 120. The material of the gate dielectric layer 122 has a high dielectric constant. A preferable material for the gate dielectric layer 122 has a dielectric constant no less than 15, such as tantalum oxide ($Ta_2O_5$) with a thickness of about 40 to about 120 Angstroms. A metal layer 126 is formed on the substrate 100 and fills the remaining space of the opening 120. A material of the metal layer 126 can be, for example, tungsten formed by, for example, chemical vapor deposition. To increase the adhesion between the metal layer 126 and the other materials, it is better to cover the gate dielectric layer 122 with a glue layer 124 before the metal layer 126 is formed. A material of the glue layer 124 can be, for example, titanium nitride formed by, for example, chemical vapor deposition or physical vapor deposition.

Figure 1H:
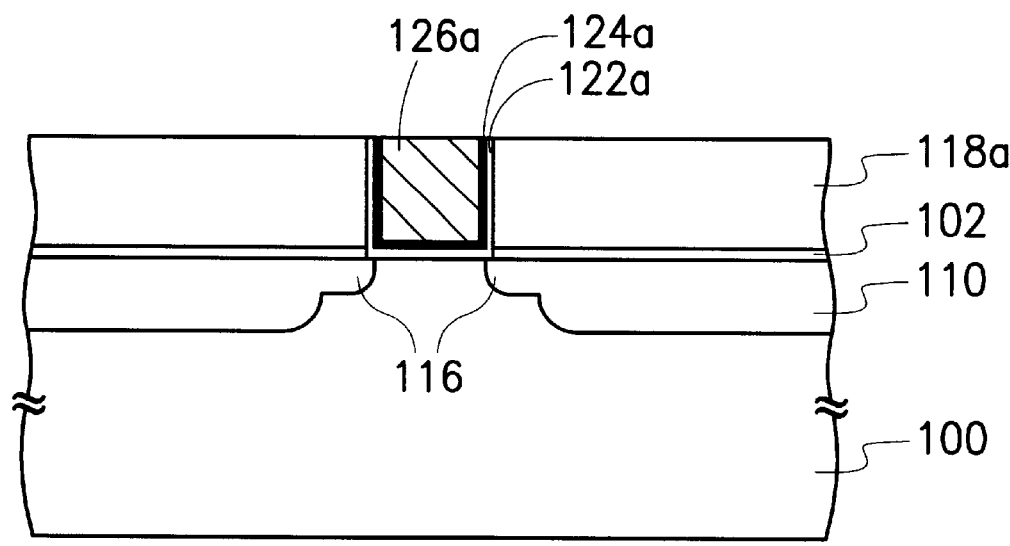

Referring to FIG. 1H, the gate dielectric layer 122, the glue layer 124 and the metal layer 126 are removed until reaching the top of the dielectric layer 118a. The remaining gate dielectric layer 122a, glue layer 124a and metal layer 126a are thus situated inside the opening 120. The metal layer 126a is used as the gate of a MOS device, and the gate dielectric layer 122a is used to replace the gate oxide layer of a MOS device used in the prior art. A preferable method to remove the metal layer 126, the glue layer 124 and the gate dielectric layer 122 over the surface of the dielectric layer 118a is to apply chemical mechanical polishing (CMP).

In conclusion, the source/drain 110 is formed in the substrate 100 before the metal gate 126a is formed in this invention. Since the high temperature annealing process of the source/drain 110 is applied before the deposition step for the metal layer 126 of the metal gate 126a, the metal gate 126a is free from the damage of the high temperature annealing process.

Furthermore, metal material is used for the metal gate 126a in this invention as a substitute for the conventional polysilicon or polycide material; therefore, the gate resistivity can be reduced to enhance operation performance of the device. This invention prevents the prior art problems derived from the capacitance depletion region and boron penetration.

In addition, a dielectric layer with high dielectric constant is used to form the gate dielectric layer 122, 122a in this invention; hence, the capacitance of the MOS device in this invention can be increased by using high dielectric constant material. Therefore, it is not necessary to reduce the thickness of the gate dielectric layer in order to increase the capacitance of the MOS device in this invention. This invention prevents the prior art current leakage problem due to the gate dielectric layer being too thin. The Second Preferred Embodiment The second preferred embodiment of this invention provides another method of fabricating a MOS device. The process steps of the first preferred embodiment illustrated in FIG. 1A to FIG. 1C are replaced by the process steps of the second embodiment illustrated in FIG. 2A to FIG. 2B.

Figure 2A:
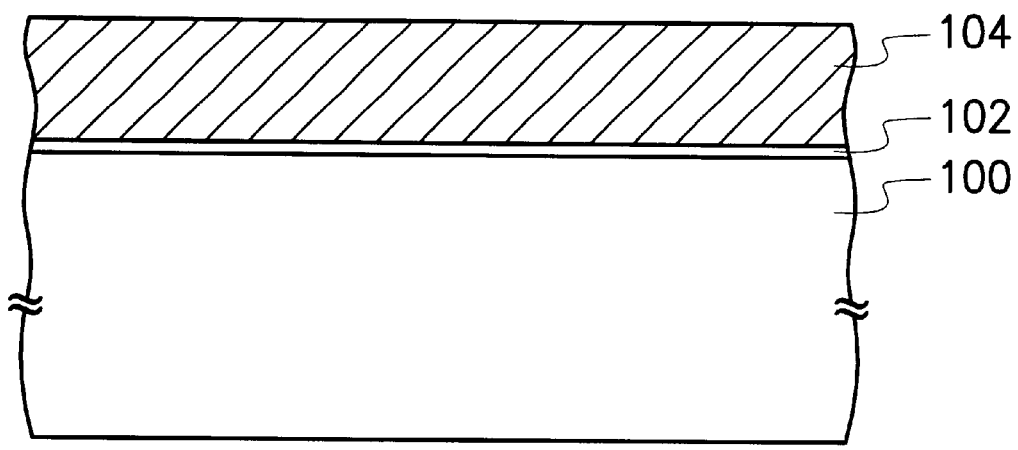
FIG. 2A and FIG. 2B schematic, cross-sectional views illustrating the process steps of fabricating a MOS device according to the second preferred embodiment of this invention.

Referring to FIG. 2A, an oxide layer 102 is formed on a provided substrate 100 to protect the surface of the substrate 100 during the subsequent fabrication process. The oxide layer 102 is formed by conventional methods, such as, thermal oxidation to a thickness of about 50 to about 500 Angstroms. A dummy gate layer 104 is formed on the oxide layer 102. The material of the dummy gate layer 104 has an etching rate that is different from the etching rate of the oxide layer 102. A preferable material of the dummy gate layer 104 comprises polysilicon formed by, for example, chemical vapor deposition to a thickness of about 1000 to about 8000 Angstroms.

Figure 2B:
Figure 2B:
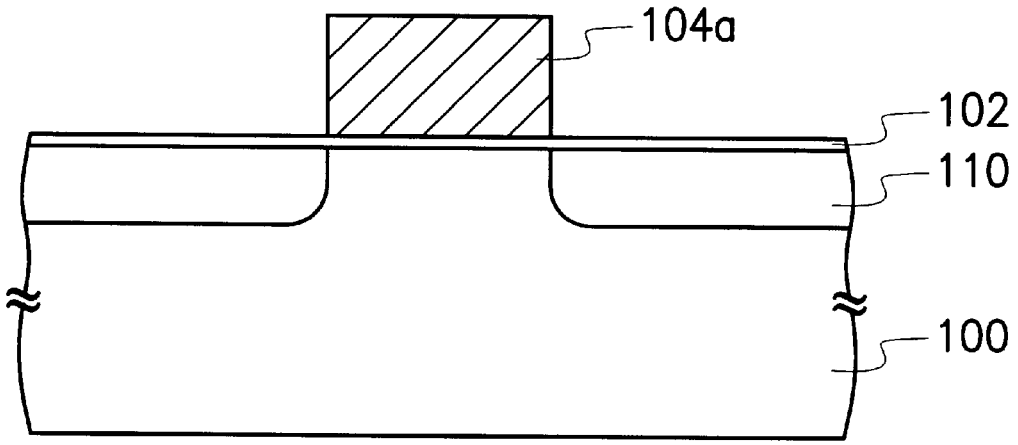

Referring to FIG. 2B, the dummy gate layer 104 are defined by photolithography and etching to form a patterned dummy gate 104a. Using the dummy gate 104a as an implantation mask, dopants are implanted into the substrate 100 by a first ion implantation process 128. Dopants in the substrate 100 are activated by a high temperature annealing process and the source/drain 110 is formed. The temperature in the high temperature annealing process is from about 950 to about 1000 degrees Centigrade, with a duration ranging from about 30 to about 50 seconds.

Referring back to FIG. 1D, a step is performed, preferably by, for example, chemical dry etching, to reduce the width of the dummy gate 104a and to form thereby the dummy gate 104b. The second ion implantation process 114 is then performed while using the narrower dummy gate 104b as an implantation mask. The low temperature annealing process is subsequently performed to activate dopants in the substrate 100 and to form thereby the source/drain extension 116. The temperature used in the process is from about 850 to about 900 degrees Centigrade, with a duration ranging from about 20 to about 40 seconds.

The following steps of this process are the same as those illustrated by FIG. 1E to FIG. 1H; therefore, no more description is provided.

In the method described herein, the dummy gate 104a is used as the implantation mask for forming the source/drain 110; then chemical dry etching is used to reduce the width of the dummy gate 104a. The narrower dummy gate 104b is used as the implantation mask when forming the source/drain extension 116. A high temperature annealing process is performed after the first ion implantation process 128 of the source/drain 110, and a low temperature annealing process is performed after the second ion implantation process 114 of the source/drain extension 116. The high temperature annealing process is performed after the first ion implantation process 128 of the source/drain 110 and before the second ion implantation process 114 of the source/drain extension 116. Furthermore, the low temperature annealing process makes the source/drain extension 116 form the expected implantation profile and junction depth. Therefore, this invention can prevent problems present in the prior art. In the prior art, the ion implantation process of the source/drain extension is applied before the high temperature annealing process, causing problems derived from the improper control of the implantation profile and the overly deep junction depth of the source/drain extension.

In conclusion, this invention has these following advantages:

1. In is invention, high dielectric constant material is used to form the gate dielectric layer; therefore, the invention can provide enough gate capacitance and prevent current leakage in the gate dielectric layer.

2. In this invention, high dielectric constant material is used to form the gate dielectric layer; therefore, a definite thickness of the gate dielectric layer can be maintained to prevent poor reliability as seen in the prior art, resulting from the gate dielectric layer being too thin. Additionally, this invention provides enough gate current.

3. In this invention, metal material, instead of polysilicon, is used to form the gate of the MOS device to prevent the prior art problems arising from the boron penetration and the capacitance depletion region.

4. In this invention, metal material is used to form the gate of the MOS device; therefore, the gate resistivity can be reduced to enhance the operation performance of the device.

5. In this invention the method of fabrication can produce a source/drain extension with a shallow junction depth and maintain the implantation profile of the source/drain extension.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a MOS device, comprising:

forming an oxide layer on a substrate;

forming a dummy gate on the oxide layer;

using the dummy gate as an implantation mask for a first ion implantation step to form a source/drain in the substrate;

reducing a width of the dummy gate;

using the dummy gate as an implantation mask for a second ion implantation step to form a source/drain extension in the substrate;

forming a planarized dielectric layer on the substrate, with a top of the dummy gate exposed;

removing the dummy gate and the oxide layer thereunder to form an opening inside the dielectric layer;

forming a gate dielectric layer on a bottom and sidewalls of the opening; and forming a metal gate inside the opening.

2. The method as claimed in claim 1, wherein the step of reducing the width of the dummy gate comprises a chemical dry etching process.

3. The method as claimed in claim 1, wherein an etching rate of the dummy gate is different from etching rates of the oxide layer and the dielectric layer.

4. The method as claimed in claim 1, wherein the step of forming the planarized dielectric layer comprises:

forming a dielectric layer on the substrate to cover the oxide layer and the dummy gate; and removing an upper part of the dielectric layer by chemical-mechanical polishing until the top of the dummy gate is exposed, so that a remaining part of the dielectric layer becomes the planarized dielectric layer.

5. The method as claimed in claim 1, comprising further a first rapid thermal annealing step following the first ion implantation step and a second rapid thermal annealing step following the second ion implantation step, wherein the first rapid thermal annealing step is performed at a temperature higher than a temperature which the second rapid thermal annealing step is performed at.

6. The method as claimed in claim 1, wherein a dielectric constant of the gate dielectric layer is no less than 15.

7. The method as claimed in claim 1, wherein the steps of forming the gate dielectric layer and the metal gate comprise:

forming a gate dielectric layer on the substrate to cover a surface of the planarized dielectric layer and the bottom as well as the sidewalls of the opening;

forming a metal layer over the substrate to cover a surface of the gate dielectric layer and to fill the opening; and removing the gate dielectric layer and the metal layer above the surface of the planarized dielectric layer.

8. The method as claimed in claim 7, wherein the step of removing the metal layer above the surface of the dielectric layer comprises chemical mechanical polishing.

9. The method as claimed in claim 7, further comprising forming a glue layer over the substrate before forming the metal layer.

10. A method of fabricating a MOS device, comprising:

forming an oxide layer on a substrate;

forming a dummy gate layer and a cap layer sequentially on the oxide layer;

patterning the cap layer and the dummy gate layer in order to form a patterned cap layer and a patterned dummy gate;

reducing a width of the dummy gate;

using the patterned cap layer as an implantation mask for a first ion implantation step to form a source/drain in the substrate;

removing the patterned cap layer;

using the dummy gate as an implantation mask for a second ion implantation step to form a source/drain extension in the substrate;

forming a planarized dielectric layer on the substrate, with a top of the dummy gate exposed;

removing the dummy gate and the oxide layer thereunder to form an opening inside the dielectric layer;

forming a gate dielectric layer on a bottom and sidewalls of the opening; and forming a metal gate inside the opening.

11. The method as claimed in claim 10, wherein the patterned cap layer is thick enough to prevent dopants from being implanted into a region of the substrate masked by the cap layer.

12. The method as claimed in claim 10, wherein an etching rate of the cap layer is different from that of the dummy gate layer.

13. The method as claimed in claim 10, wherein an etching rate of the dummy gate layer is different from that of the oxide layer.

14. The method as claimed in claim 10, wherein the width of the dummy gate is reduced by a chemical dry etching process.

15. The method as claimed in claim 10, wherein an etching rate of the dummy gate is different from that of the dielectric layer.

16. The method as claimed in claim 10, wherein the steps of forming the planarized dielectric layer comprise:

forming a dielectric layer on the substrate to cover the oxide layer and the dummy gate; and removing the upper part of the dielectric layer by chemical-mechanical polishing until reaching the top of the dummy gate, so that a remaining part of the dielectric layer becomes the planarized dielectric layer.

17. The method as claimed in claim 10, comprising further a first rapid thermal annealing step following the first ion implantation step and a second rapid thermal annealing step following the second ion implantation step, wherein the first rapid thermal annealing step is performed at a temperature higher than a temperature which the second rapid thermal annealing step is performed at.

18. The method as claimed in claim 10, wherein a dielectric constant of the gate dielectric layer is no less than 15.

19. The method as claimed in claim 10, wherein the step of forming the gate dielectric layer and the metal gate comprises:

forming a gate dielectric layer on the substrate to cover a surface of the planarized dielectric layer and the bottom as well as sidewalls of the opening;

forming a metal layer over the substrate to cover a surface of the gate dielectric layer and fill the opening; and removing the gate dielectric layer and the metal layer above the surface of the planarized dielectric layer.

20. The method as claimed in claim 19, wherein the step of removing the metal layer above the surface of the dielectric layer comprises chemical mechanical polishing.

21. The method as claimed in claim 10, further comprising forming a glue layer over the substrate before forming the metal layer.

22. A method of fabricating a MOS device, comprising:
forming an oxide layer on a substrate;
forming a dummy gate layer and a cap dielectric layer sequentially on the oxide layer;
patterning the cap dielectric layer and the dummy gate layer in order to form a patterned cap dielectric layer and a patterned dummy gate;
reducing a width of the dummy gate;
using the patterned cap dielectric layer as an implantation mask for a first ion implantation step to form a source/drain in the substrate;
removing the patterned cap dielectric layer;
using the dummy gate as an implantation mask for a second ion implantation step to form a source/drain extension in the substrate;
forming a planarized dielectric layer on the substrate, with a top of the dummy gate exposed;
removing the dummy gate and the oxide layer thereunder to form an opening inside the planarized dielectric layer;
forming a gate dielectric layer on a bottom and sidewalls of the opening; and
forming a metal gate inside the opening.

* * * * *